United States Patent
Raring et al.

(10) Patent No.: US 11,664,643 B1
(45) Date of Patent: *May 30, 2023

(54) NARROW SIZED LASER DIODE

(71) Applicant: KYOCERA SLD Laser, Inc., Goleta, CA (US)

(72) Inventors: James W. Raring, Santa Barbara, CA (US); Hua Huang, Vancouver, WA (US)

(73) Assignee: KYOCERA SLD Laser, Inc., Goleta, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/546,799

(22) Filed: Dec. 9, 2021

Related U.S. Application Data

(63) Continuation of application No. 16/658,693, filed on Oct. 21, 2019, now Pat. No. 11,217,966, which is a
(Continued)

(51) Int. Cl.
*H01S 5/02345* (2021.01)
*H01S 5/343* (2006.01)
(Continued)

(52) U.S. Cl.
CPC ........ *H01S 5/34333* (2013.01); *H01S 5/0014* (2013.01); *H01S 5/0202* (2013.01); *H01S 5/0203* (2013.01); *H01S 5/0234* (2021.01); *H01S 5/02345* (2021.01); *H01S 5/02375* (2021.01); *H01S 5/1082* (2013.01); *H01S 5/22* (2013.01); *H01S 5/3013* (2013.01);
(Continued)

(58) Field of Classification Search
CPC ......... H01S 5/22–2228; H01S 5/34333; H01S 5/32341; H01S 5/3202; H01S 5/0233–02345

See application file for complete search history.

(56) References Cited

U.S. PATENT DOCUMENTS

| | | | |
|---|---|---|---|
| 4,341,592 | A | 7/1982 | Shortes et al. |
| 4,860,687 | A | 8/1989 | Frijlink |

(Continued)

FOREIGN PATENT DOCUMENTS

| | | |
|---|---|---|
| JP | 03287770 | 12/1991 |
| JP | 2007-173467 | 7/2007 |

OTHER PUBLICATIONS

U.S. Appl. No. 12/491,169, Final Office Action, dated May 11, 2011, 10 pages.
(Continued)

*Primary Examiner* — Tod T Van Roy
*Assistant Examiner* — Delma R Fordé
(74) *Attorney, Agent, or Firm* — Kilpatrick Townsend & Stockton LLP

(57) ABSTRACT

Gallium and nitrogen containing optical devices operable as laser diodes and methods of forming the same are disclosed. The devices include a gallium and nitrogen containing substrate member, which may be semipolar or non-polar. The devices include a chip formed from the gallium and nitrogen substrate member. The chip has a width and a length, a dimension of less than 150 microns characterizing the width of the chip. The devices have a cavity oriented substantially parallel to the length of the chip.

20 Claims, 7 Drawing Sheets

Related U.S. Application Data continuation of application No. 15/982,323, filed on May 17, 2018, now Pat. No. 10,490,980, which is a continuation of application No. 15/485,474, filed on Apr. 12, 2017, now Pat. No. 9,985,417, which is a continuation of application No. 14/742,297, filed on Jun. 17, 2015, now Pat. No. 9,640,949, which is a continuation of application No. 13/928,805, filed on Jun. 27, 2013, now Pat. No. 9,088,135.

(60) Provisional application No. 61/666,414, filed on Jun. 29, 2012.

(51) Int. Cl.
*H01S 5/30* (2006.01)
*H01S 5/02* (2006.01)
*H01S 5/22* (2006.01)
*H01S 5/323* (2006.01)
*H01S 5/32* (2006.01)
*H01S 5/0234* (2021.01)
*H01S 5/02375* (2021.01)
*H01S 5/00* (2006.01)
*H01S 5/10* (2021.01)

(52) U.S. Cl.
CPC ...... *H01S 5/3202* (2013.01); *H01S 5/320275* (2019.08); *H01S 5/32341* (2013.01); *H01L 2224/48091* (2013.01); *H01L 2224/48465* (2013.01); *H01S 5/0042* (2013.01); *H01S 5/32025* (2019.08)

(56) References Cited

U.S. PATENT DOCUMENTS

| | | |
|---|---|---|
| 4,911,102 A | 3/1990 | Manabe et al. |
| 5,331,654 A | 7/1994 | Jewell et al. |
| 5,527,417 A | 6/1996 | Iida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,888,907 A | 3/1999 | Tomoyasu et al. |
| 5,951,923 A | 9/1999 | Horie et al. |
| 6,547,249 B2 | 4/2003 | Collins, III et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,814,811 B2 | 11/2004 | Ose |
| 7,009,199 B2 | 3/2006 | Hall |
| 7,303,630 B2 | 12/2007 | Motoki et al. |
| 7,312,156 B2 | 12/2007 | Granneman et al. |
| 7,390,359 B2 | 6/2008 | Miyanaga et al. |
| 7,483,466 B2 | 1/2009 | Uchida et al. |
| 7,489,441 B2 | 2/2009 | Scheible et al. |
| 7,749,326 B2 | 7/2010 | Kim et al. |
| 7,806,078 B2 | 10/2010 | Yoshida |
| 8,247,887 B1 | 8/2012 | Raring et al. |
| 8,314,429 B1 | 11/2012 | Raring et al. |
| 8,350,273 B2 | 1/2013 | Vielemeyer |
| 8,422,525 B1 | 4/2013 | Raring et al. |
| 8,427,590 B2 | 4/2013 | Raring et al. |
| 8,494,017 B2 | 7/2013 | Sharma et al. |
| 8,524,578 B1 | 9/2013 | Raring et al. |
| 9,088,135 B1 | 7/2015 | Raring et al. |
| 9,640,949 B1 | 5/2017 | Raring et al. |
| 9,985,417 B1 | 5/2018 | Raring et al. |
| 10,490,980 B1 | 11/2019 | Raring et al. |
| 11,217,966 B1 | 1/2022 | Raring et al. |
| 2002/0027933 A1 | 3/2002 | Tanabe et al. |
| 2003/0000453 A1 | 1/2003 | Unno et al. |
| 2003/0001238 A1 | 1/2003 | Ban |
| 2003/0020087 A1 | 1/2003 | Goto et al. |
| 2003/0138009 A1 | 7/2003 | Weigert et al. |
| 2003/0200931 A1 | 10/2003 | Goodwin |
| 2004/0099213 A1 | 5/2004 | Adomaitis et al. |
| 2005/0229855 A1 | 10/2005 | Raaijmakers |
| 2006/0060131 A1 | 3/2006 | Atanackovic |
| 2006/0086319 A1 | 4/2006 | Kasai et al. |
| 2006/0144334 A1 | 7/2006 | Yim et al. |
| 2006/0216416 A1 | 9/2006 | Sumakeris et al. |
| 2007/0093073 A1 | 4/2007 | Farrell, Jr. et al. |
| 2007/0165686 A1 | 7/2007 | Miyazaki |
| 2007/0280320 A1 | 12/2007 | Feezell et al. |
| 2008/0151960 A1 | 6/2008 | Furushima et al. |
| 2008/0164578 A1 | 7/2008 | Tanikella et al. |
| 2008/0198881 A1 | 8/2008 | Farrell et al. |
| 2008/0217745 A1 | 9/2008 | Miyanaga et al. |
| 2008/0251020 A1 | 10/2008 | Franken et al. |
| 2008/0283851 A1 | 11/2008 | Akita |
| 2008/0298409 A1 | 12/2008 | Yamashita et al. |
| 2009/0229519 A1 | 9/2009 | Saitoh |
| 2009/0250686 A1 | 10/2009 | Sato et al. |
| 2010/0006873 A1 | 1/2010 | Raring et al. |
| 2010/0091808 A1 | 4/2010 | Takahira |
| 2010/0189146 A1 | 7/2010 | Bessho et al. |
| 2010/0195687 A1 | 8/2010 | Okamoto et al. |
| 2010/0219419 A1 | 9/2010 | Hata et al. |
| 2010/0220262 A1 | 9/2010 | DeMille et al. |
| 2010/0302464 A1 | 12/2010 | Raring et al. |
| 2010/0309943 A1 | 12/2010 | Chakraborty et al. |
| 2011/0075694 A1 | 3/2011 | Yoshizumi et al. |
| 2011/0170569 A1 | 7/2011 | Tyagi et al. |
| 2011/0180781 A1 | 7/2011 | Raring et al. |
| 2011/0247556 A1 | 10/2011 | Raring et al. |
| 2011/0249694 A1 | 10/2011 | Nishiguchi et al. |
| 2011/0286484 A1 | 11/2011 | Raring et al. |
| 2013/0016750 A1 | 1/2013 | Raring et al. |
| 2013/0022064 A1 | 1/2013 | Raring et al. |
| 2015/0229107 A1* | 8/2015 | McLaurin ............ H01S 5/0234 372/45.01 |

OTHER PUBLICATIONS

U.S. Appl. No. 12/491,169, Non-Final Office Action, dated Oct. 22, 2010, 10 pages.

U.S. Appl. No. 12/497,289, Non-Final Office Action, dated Feb. 2, 2012, 7 pages.

U.S. Appl. No. 12/497,289, Notice of Allowance, dated May 22, 2012, 7 pages.

U.S. Appl. No. 12/880,803, Non-Final Office Action, dated Feb. 22, 2012, 9 pages.

U.S. Appl. No. 12/880,803, Notice of Allowance, dated Jul. 18, 2012, 5 pages.

U.S. Appl. No. 12/995,946, Final Office Action, dated Aug. 2, 2013, 16 pages.

U.S. Appl. No. 12/995,946, Non-Final Office Action, dated Mar. 28, 2012, 18 pages.

U.S. Appl. No. 12/995,946, Non-Final Office Action, dated Jan. 29, 2013, 25 pages.

U.S. Appl. No. 13/046,565, Final Office Action, dated Feb. 2, 2012, 17 pages.

U.S. Appl. No. 13/046,565, Final Office Action, dated Jul. 19, 2012, 24 pages.

U.S. Appl. No. 13/046,565, Non-Final Office Action, dated Nov. 7, 2011, 17 pages.

U.S. Appl. No. 13/046,565, Non-Final Office Action, dated Apr. 13, 2012, 40 pages.

U.S. Appl. No. 13/548,635, Non-Final Office Action, dated Jun. 14, 2013, 6 pages.

U.S. Appl. No. 13/548,635, Notice of Allowance, dated Sep. 16, 2013, 6 pages.

U.S. Appl. No. 13/548,770, Notice of Allowance, dated Jun. 25, 2013, 6 pages.

U.S. Appl. No. 13/606,894, Non-Final Office Action, dated Feb. 5, 2013, 8 pages.

U.S. Appl. No. 13/606,894, Notice of Allowance, dated May 24, 2013, 9 pages.

U.S. Appl. No. 13/928,805, Final Office Action, dated Oct. 15, 2014, 21 pages.

(56) References Cited

OTHER PUBLICATIONS

U.S. Appl. No. 13/928,805, Non-Final Office Action, dated Apr. 24, 2014, 20 pages.
U.S. Appl. No. 13/928,805, Notice of Allowance, dated Mar. 17, 2015, 10 pages.
U.S. Appl. No. 14/742,297, Notice of Allowance, dated Dec. 22, 2016, 12 pages.
U.S. Appl. No. 15/485,474, Notice of Allowance, dated Feb. 2, 2018, 10 pages.
U.S. Appl. No. 15/982,323, First Action Interview Pilot Program Pre-Interview Communication, dated Jun. 3, 2019, 5 pages.
U.S. Appl. No. 15/982,323, Notice of Allowance, dated Jul. 22, 2019, 11 pages.
U.S. Appl. No. 16/658,693, Final Office Action, dated Jun. 8, 2021, 21 pages.
U.S. Appl. No. 16/658,693, Final Office Action, dated Aug. 10, 2020, 34 pages.
U.S. Appl. No. 16/658,693, Non-Final Office Action, dated Feb. 2, 2021, 18 pages.
U.S. Appl. No. 16/658,693, Non-Final Office Action, dated Mar. 31, 2020, 32 pages.
U.S. Appl. No. 16/658,693, Notice of Allowance, dated Aug. 25, 2021, 10 pages.
Founta et al., "Anisotropic Morphology of Nonpolar a-Plane GaN Quantum Dots and Quantum Wells", Journal of Applied Physics, vol. 102, No. 7, Oct. 2, 2007, pp. 074304-1-074304-6.
Sato et al., "Optical Properties of Yellow Light-Emitting-Diodes Grown on Semipolar (1122) Bulk GaN Substrates", Applied Physics Letter, vol. 92, No. 22, Jun. 5, 2008, pp. 221110-1-221110-3.

\* cited by examiner

NARROW SIZED LASER DIODE

CROSS-REFERENCE TO RELATED APPLICATIONS

The present application is a continuation of U.S. application Ser. No. 16/658,693, filed Oct. 21, 2019, which is a continuation of U.S. application Ser. No. 15/982,323, filed May 17, 2018, which is a continuation of U.S. application Ser. No. 15/485,474, filed Apr. 12, 2017, which is a continuation of U.S. application Ser. No. 14/742,297, filed Jun. 17, 2015, now U.S. Pat. No. 9,640,949, which is a continuation of U.S. application Ser. No. 13/928,805, filed Jun. 27, 2013, now U.S. Pat. No. 9,088,135, which claims priority to U.S. Application No. 61/666,414, filed Jun. 29, 2012, each of which are incorporated herein by reference in their entirety for all purposes.

FIELD

The present invention relates generally to optical techniques. More specifically, the present invention provides methods and devices using semi-polar oriented gallium and nitrogen containing substrates for optical applications.

BACKGROUND

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal, which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature, which limits their application.

From the above, it can be appreciated that techniques for improving optical devices are highly desired.

SUMMARY

The present invention is directed to optical devices and related methods. More particularly, the present invention provides methods and devices for emitting electromagnetic radiation using semipolar gallium containing substrates such as GaN, AlN, InN, InGaN, AlGaN, and AlInGaN, and others. Merely by way of example, the invention can be applied to optical devices, lasers, light emitting diodes, displays (e.g., laser), general lighting, solar cells, photoelectrochemical water splitting and hydrogen generation devices, photodetectors, integrated circuits, and transistors, among other devices.

In a specific example, the present invention provides a gallium and nitrogen containing optical device operable as a laser diode. The device has a gallium and nitrogen containing substrate member and a chip formed from the gallium and nitrogen substrate member. The chip has a width and a length. The device has a cavity oriented substantially parallel to the length of the chip, a dimension of less than 150 microns characterizing the width of the chip, and a pair of etched facets configured on the cavity of the chip. The pair of etched facets includes a first facet configured at a first end of the cavity and a second facet configured at a second end of the cavity and a substrate member operably mounted such that a p-type region of the chip is facing the substrate member.

In an example, the present invention provides a gallium and nitrogen containing optical device operable as a laser diode. The device has a gallium and nitrogen containing substrate member and a chip formed from the gallium and nitrogen substrate member, the chip having a width and a length. The device has a cavity oriented substantially parallel to the length of the chip and a dimension of less than 110 microns characterizing the width of the chip. The device has a pair of etched facets configured on the cavity of the chip. The pair of etched facets includes a first facet configured at a first end of the cavity and a second facet configured at a second end of the cavity and a substrate member operably mounted such that a p-type region of the chip is facing the substrate member.

In an alternative example, the present invention provides a gallium and nitrogen containing optical device operable as a laser diode. The device has a gallium and nitrogen containing substrate member and the gallium and nitrogen substrate member is selected from the (20-21), (20-2-1), (30-31), (30-3-1), (11-22) semipolar orientations such as an m-plane nonpolar orientation, or an offcut of any of the foregoing. The device has a chip formed from the gallium and nitrogen substrate member, the chip having a width and a length and a cavity oriented substantially parallel to the length of the chip. The device has a dimension of less than 150 microns characterizing the width of the chip and a pair of etched facets configured on the cavity of the chip. The pair of etched facets includes a first facet configured at a first end of the cavity and a second facet configured at a second end of the cavity and a substrate member operably mounted such that a p-type region of the chip is facing the substrate member.

In some embodiments, the present invention provides a gallium and nitrogen containing optical device operable as a laser diode. The device includes a gallium and nitrogen containing substrate member, which can be a semipolar surface or a non-polar surface. A device includes a chip formed from the gallium and nitrogen substrate member. The chip has a width and a length. A device has a cavity oriented substantially parallel to the length of the chip, a dimension of less than 120 microns characterizing the width of the chip, and a pair of etched facets configured on the cavity of the chip. The pair of etched facets includes a first facet configured at a first end of the cavity and a second facet configured at a second end of the cavity.

Benefits are achieved over existing techniques using the present invention. In particular, the present invention enables a cost-effective optical device for laser applications. In some embodiments, the present optical devices provided by the present disclosure can be manufactured in a relatively simple and cost effective manner. Depending upon the embodiment, the present apparatus and methods can be manufactured using conventional materials and/or methods according to one of ordinary skill in the art. The present methods and devices include etched facets, thick quantum well (QW) layers, thin barrier layers, AlGaN cladding free for p-clad, n-clad, or both claddings, and the devices are operable in the 395-420 nm range, 420-440 nm range, 440-475 nm range, 475-505 nm range, or 505-535 nm range, and in specific embodiments, in the 440-475 nm range. As used herein the thick active regions (e.g., summation of all light emitting layers within the device structures, including QW and double hetero-structures) can achieve higher model confinement leading to higher model gain, and an ability to grow laser diode structures that may be free from AlGaN cladding regions or aluminum containing cladding regions, which limits c-plane devices. In some embodiments, the methods provided by the present disclosure can be applied to nonpolar and semipolar substrates including the nonpolar m-plane and the semipolar (20-21), (20-2-1), (30-31), (30-3-1), (11-22), and an offcut of any of the foregoing. Depending upon the embodiment, one or more of these benefits may be achieved. These and other benefits may be described throughout the present specification and more particularly below.

In certain aspects, gallium and nitrogen containing optical devices operable as a laser diode are provided, the devices comprising gallium and nitrogen containing substrate member; a chip formed from the gallium and nitrogen substrate member, the chip having a width and a length; a cavity oriented substantially parallel to the length of the chip; a dimension of less than 120 microns characterizing the width of the chip; and a pair of etched facets configured on the cavity of the chip, the pair of etched facets including a first facet configured at a first end of the cavity and a second facet configured at a second end of the cavity.

In certain aspects, gallium and nitrogen containing optical devices operable as a laser diode are provided, the devices comprising a gallium and nitrogen containing substrate member; a chip formed from the gallium and nitrogen substrate member, the chip having a width and a length; a cavity oriented substantially parallel to the length of the chip; a dimension of less than 120 microns characterizing the width of the chip; and a substrate member operably mounted such that a p-type region of the chip is facing the substrate member.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 4A shows a conventional laser chip with a 150 μm width, and FIG. 4B shows a laser chip with a 70 μm width.

FIG. 5A is a conventional case with 150 μm wide die, and FIG. 5B is a technique that reduces a die width to 50 μm enabling three times more chips to be obtained from the wafer.

DETAILED DESCRIPTION

Figure 1:
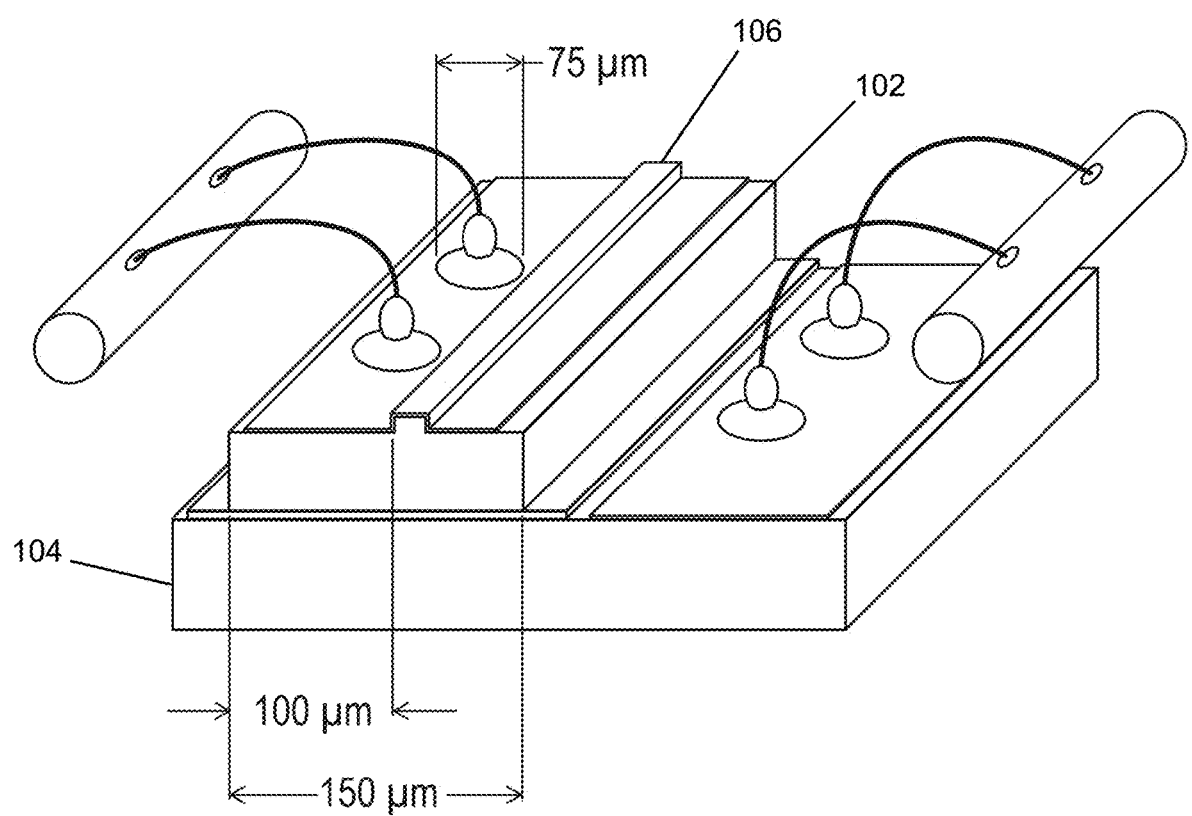
FIG. 1 shows a schematic diagram of a conventional laser diode chip mounted p-side up.

The present invention is directed to optical devices and related methods. More particularly, the present invention provides methods and devices for emitting electromagnetic radiation using semipolar gallium containing substrates such as GaN, AlN, InN, InGaN, AlGaN, and AlInGaN, and others. As used herein, the term "substrate" can mean the bulk substrate or can include overlying growth structures such as a gallium. Merely by way of example, the invention can be applied to optical devices, lasers, light emitting diodes, displays (e.g., laser), general lighting, solar cells, photoelectrochemical water splitting and hydrogen generation devices, photodetectors, integrated circuits, and transistors, among other devices. In an example, the present the gallium and nitrogen substrate member has a semipolar surface orientation and is selected from the (20-21), (20-2-1), (30-31), (30-3-1), (11-22) orientations, or an offcut of any of the foregoing. The gallium and nitrogen substrate member is a nonpolar surface orientation such as the m-plane surface, or an offcut of any of the foregoing.

According to the present invention, benefits may be achieved using the present methods and structures. That is, the present methods overcome the high cost of GaN substrates, as compared to more conventional InP and GaAs substrates, including orientations of nonpolar and semipolar GaN, which are even more expensive than conventional c-plane GaN orientations. This high substrate cost leads to a high chip cost and thus an undesirable total cost structure, which can prevent such GaN based lasers from penetrating certain markets.

A large component of GaN based laser product cost is the laser chip. This cost is driven by the cost of substrates, the cost of epitaxial growth, the cost of wafer fabrications, along with yields of the growth and process steps. By reducing the size of each laser die more lasers can be produced from a fixed area substrate size. Conventional GaN-based laser diodes are typically limited to a chip width of greater than 125 μm to enable high quality cleaved facet mirrors, to allow for sufficient width on the chip to provide an area for both a laser stripe and for a wire-bonding pad, and to allow for practical handling of the chips using conventional chip testing and die attaching techniques. As the width is decreased the challenge of forming high quality cleaved facets becomes greater, which can reduce the yield and drive costs higher.

In this disclosure, we combine etched facet lasers with p-down bonding to enable an ultra-thin foot print laser diode chip to provide substantial cost savings and manufacturing efficiency. Through the use if etched facet technology for mirror formation the device yield can be made high regardless of the laser pitch and testing of individual chips can be avoided by performing on-wafer testing of the individual devices. Furthermore, because the chip will be bonded with p-side side down such that the laser stripe will be located at the bond interface, the chip width only needs to be wide enough to accept a wirebond. This approach allows chip widths to be reduced from the 150 μm conventional value down to the 80 μm or even 50 μm wide range to enable a 1.3 to 1.8 times chip cost reduction. Further details of the present invention are found throughout the present specification and more particularly below.

FIG. 1 is an example of a conventional laser diode configuration wherein the laser chip 102 is mounted with the p-side upward and the n-side in direct contact with a submount 104. In such a configuration where wirebonding cannot be on top of the ridge waveguide 106 a sufficiently wide bonding pad must be positioned adjacent to the ridge waveguide. Because the typical footprint of a wirebond is 75-80 microns, the bond pad is often about 100 microns wide to provide sufficient wirebonding placement tolerance. The width of the chip 102 must also allow for at least 20 microns to 50 microns from the ridge to the opposite side of the chip 102 as the bond pad is on. As shown in FIG. 1, this conventional configuration results in a total chip width of greater than 120 microns to about 150 microns.

Conventional edge emitting Fabry-Perot laser diodes typically employ cleaved facet mirrors. This method of mirror formation can be very low cost and high yield in mature material systems such as GaAs or InP, and possibly for the relatively mature c-plane orientation of the GaN material system. However, in the novel nonpolar and semipolar orientations of GaN, facet cleaving can be more challenging.

Figure 2:
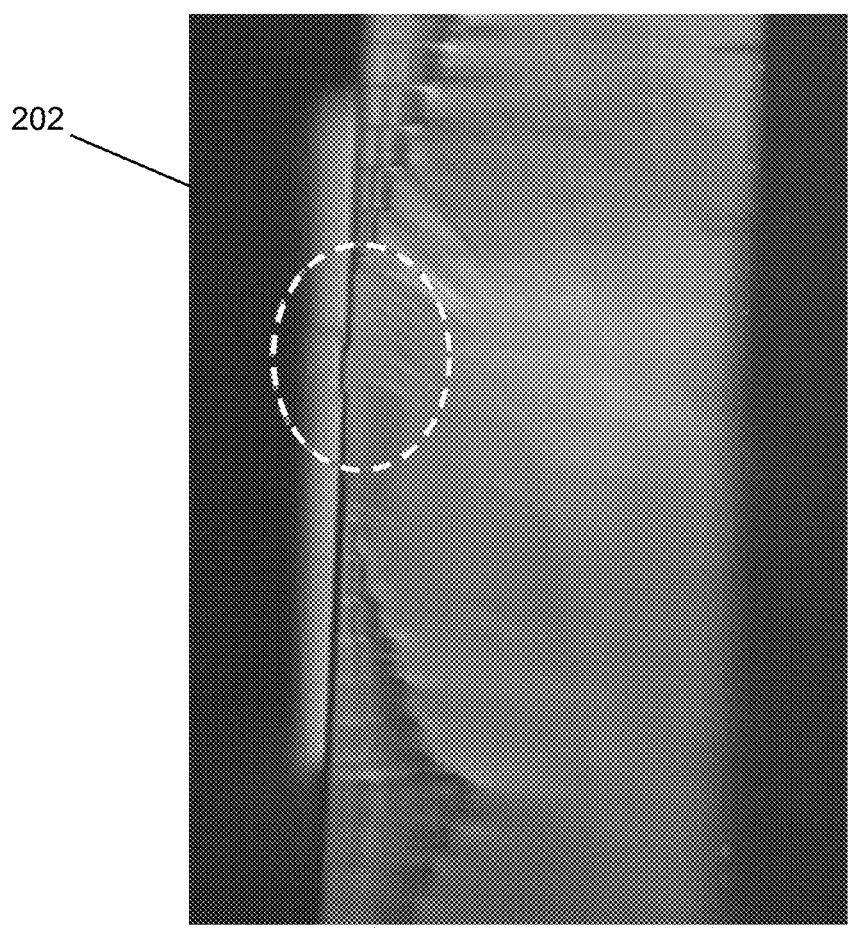
FIG. 2 shows an end-on view optical image of a cleaved facet formed on a nonpolar laser diode illustrating a defected and rough surface that can result from the cleaving process.

FIG. 2 illustrates defects 202 that can form when cleaving nonpolar facets causing rough mirrors. Such roughness at the mirrors can lead to scattered and non-optimal laser performance and potentially lead to low threshold levels for catastrophic optical mirror damage (COMD) resulting local hot spots on the facet. For nonpolar and semipolar orientations a skip and scribe technique with a laser scriber followed by a breaking step is often used to cleave facets. As the laser pitch is reduced such that more laser die can be defined on the process wafer, the distance between adjacent laser stripes becomes less such that there are more "skips" and less total "scribe" length for the skipping and scribing technique. This can lead to a higher rate of facet defects at the cleave step and hence a reduced yield. This reduction in yield offsets the die benefits from the increased number of die with the reduced stripe pitch.

Figure 3:
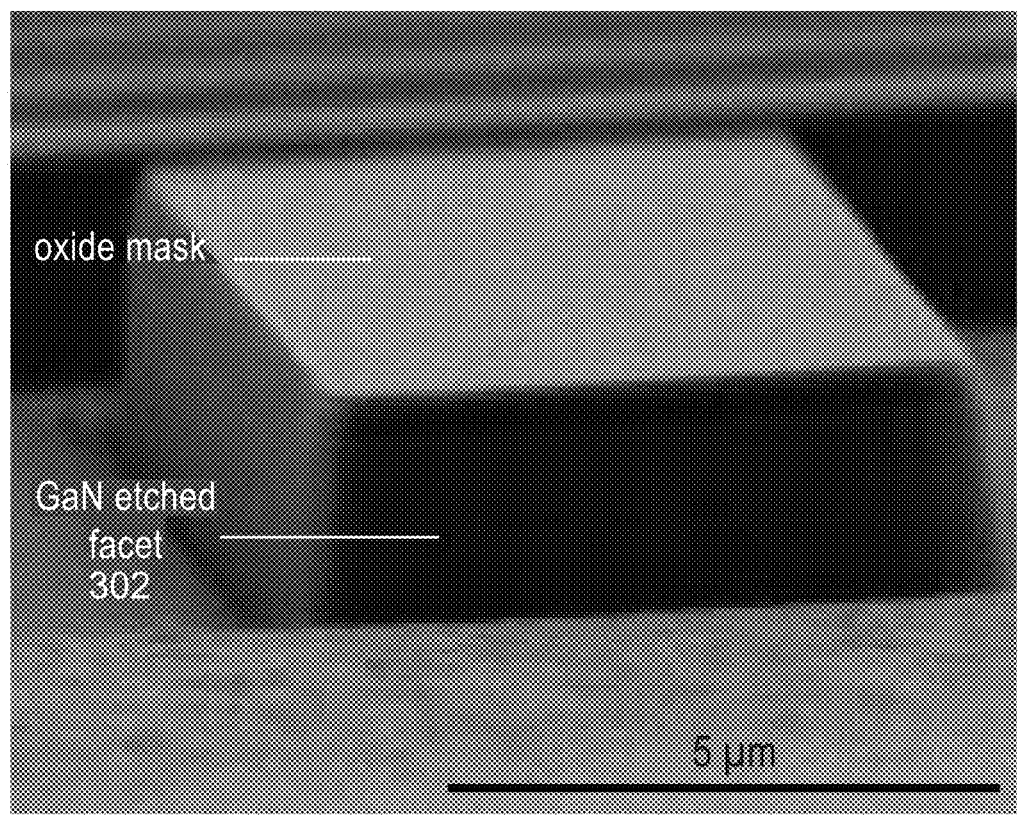
FIG. 3 shows an SEM image as an example of an etched facet of a laser device. As shown in the image, the resulting surface provides a smooth, vertical, and defect-free facet.

An alternative approach for defining laser mirrors is to us an etched facet technique. In this approach the mirrors are typically lithographically defined using a photoresist process followed by an etching step. The etch must yield a very vertical and smooth mirror surface for best laser performance. Examples of etching methods include reactive ion etching (ME), inductively plasma coupled etching (ICP), and chemical assisted ion beam etching (CAIBE). FIG. 3 is an example taken from the literature of an etched facet demonstrating a smooth, vertical, and defect free etched surface 302. Behfar et al., http://www.binoptics.com/CSMAX05_Paper.pdf. Because etched facet lasers rely on lithographic spatial definition and wafer level etching techniques for mirror formation, the facet quality will not be adversely affected by a reduced laser pitch as it may be with a cleaved facet technique. Therefore, etched facet technology can enable a very high density of nonpolar or semipolar laser diodes to be defined across a wafer to increase the die count per wafer. Further, such defect-free surfaces result in very high COMD levels. In an example, the etched facets are formed by a dry etching method such as reactive ion etching (ME), inductively plasma coupled etching (ICP), or chemical assisted ion beam etching (CAIBE).

Figure 4A:
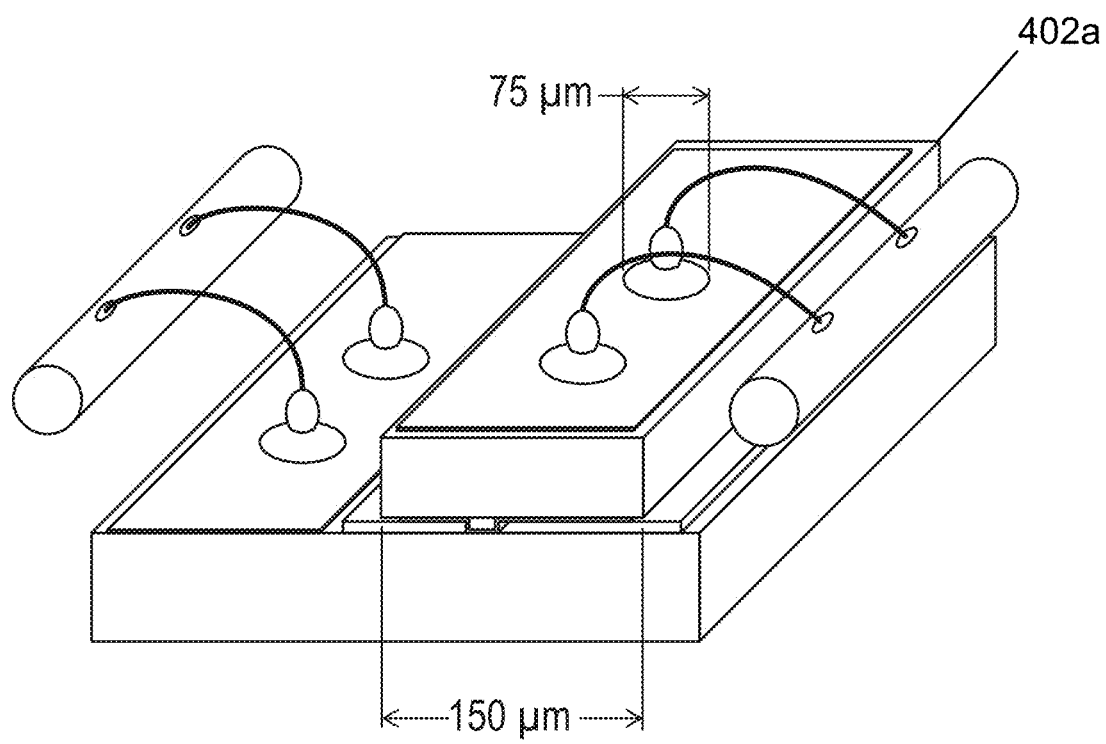
FIGS. 4A-4B show examples of p-down packaging where
Figure 4B:
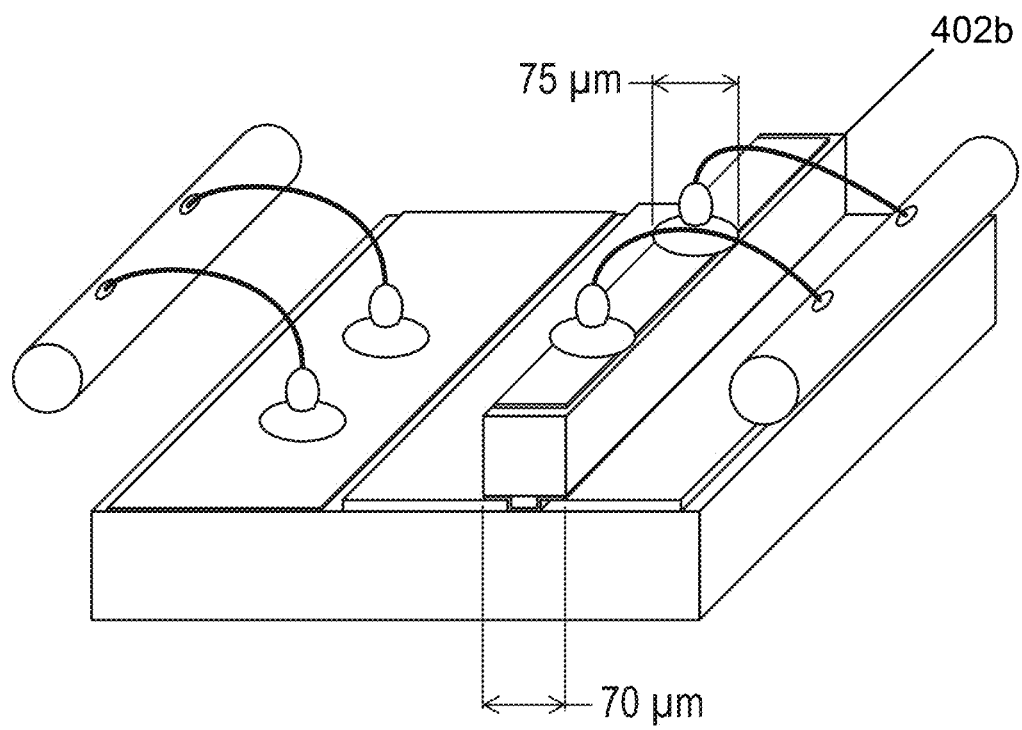

FIGS. 4A-4B illustrate p-side down bonded laser diode configurations wherein FIG. 4A shows a case using a chip 402a having a width of 150 μm and FIG. 4B shows a chip 402b having a reduced width of 70 μm. Without the necessity to bond to the side of the ridge waveguide as in the case of the p-side up configuration, the chip can be narrowed for a higher number of die per wafer and wirebonded without issues or complications.

Figure 5A:
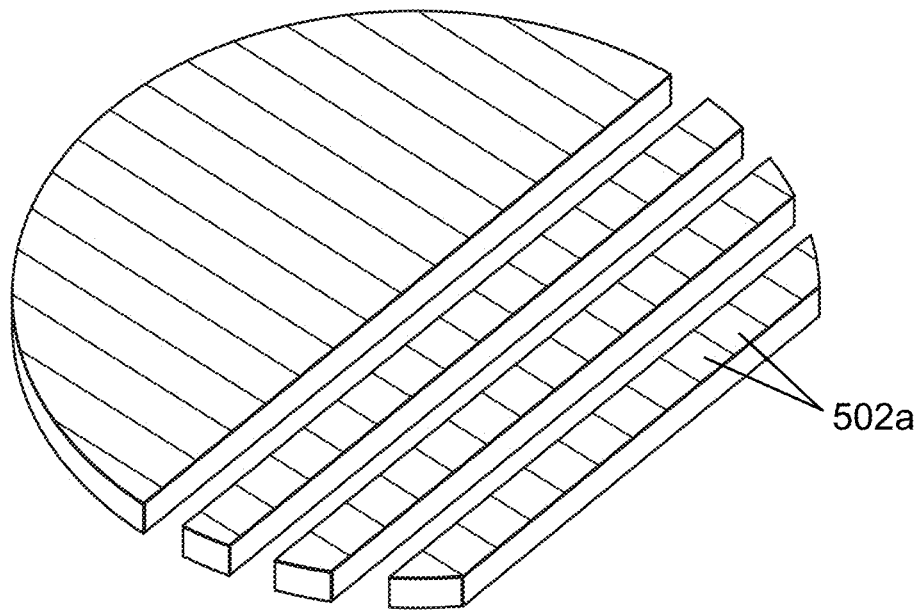
FIGS. 5A-5B show a schematic diagram example of round wafers diced into laser die where
Figure 5B:
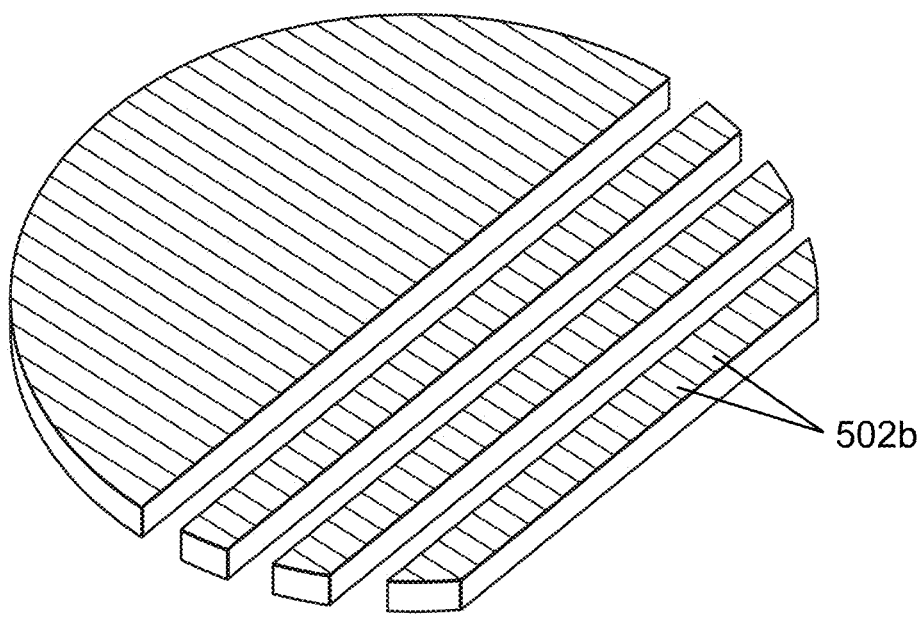
Figure 6:
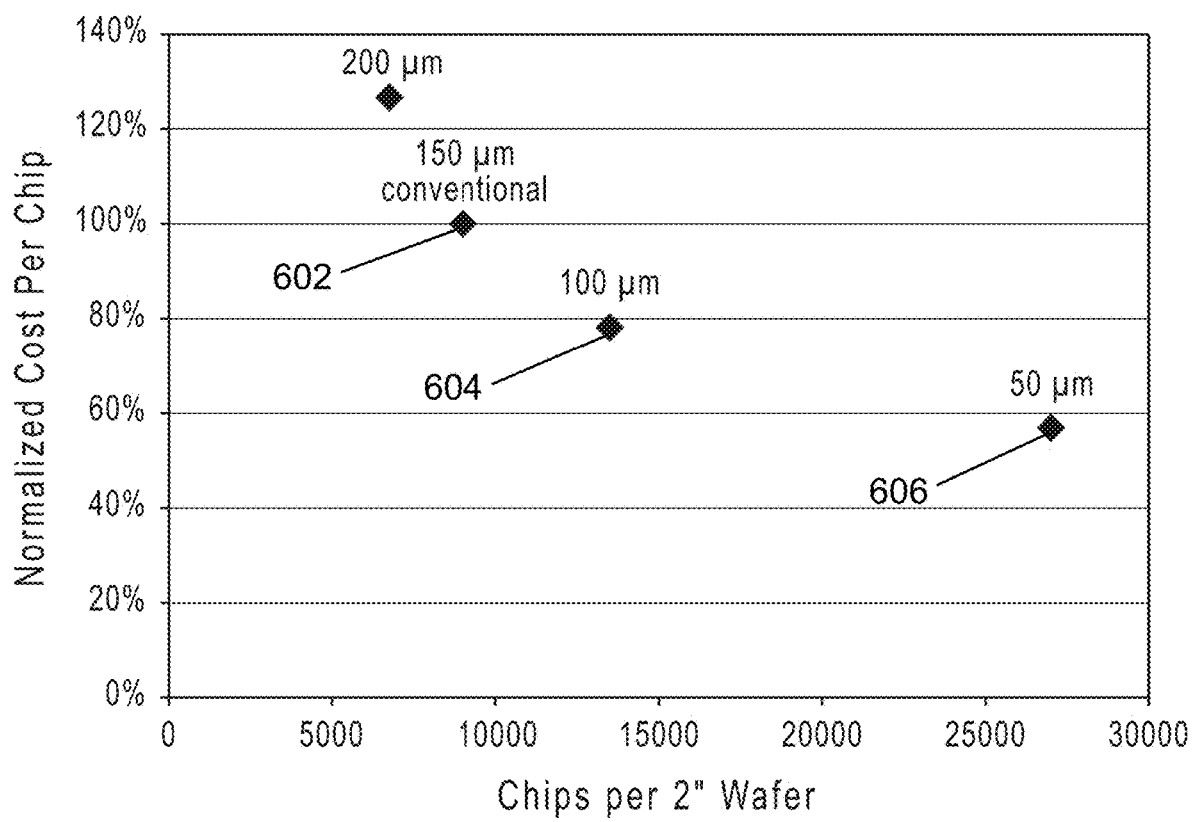
FIG. 6 presents a plot of normalized cost versus number of chips per 2-inch wafer for various die widths assuming a cavity length of 1.2 mm. The trend illustrates a cost reduction of more than 40% from the conventional 150 μm wide chip to a 50 μm wide chip.

A simplified diagram of the process used to separate fabricated wafers into individual laser dies is shown in FIGS. 5A-5B. FIG. 5A represents the case where die 502a having a width of about 150 μm is employed while FIG. 5B represents the ultra-small die size with die 502b having a width of about 50 μm. By reducing the width, the number of die per wafer can be increased by 3 times. If the yield can remain high with such a dramatic increase in number of die per wafer, substantial cost savings can be realized. To illustrate the cost saving that can accompany a decrease in laser stripe pitch and a corresponding increase in die density, the normalized cost per chip versus number of chips per 20-inch wafer for a die length of 1.2 mm and die widths of 200 μm, 150 μm, 100 μm, and 50 μm, are shown in FIG. 6. As is shown in FIG. 6, a die width is 150 μm 602 yields 9,000 die per wafer. Reducing the width to 100 μm 604 increases the die count to 13,500 for a cost savings of more than 20%, and reducing the width to 50 μm 606 increases the die count to 27,000 for a cost savings of more than 40%.

Figure 7:
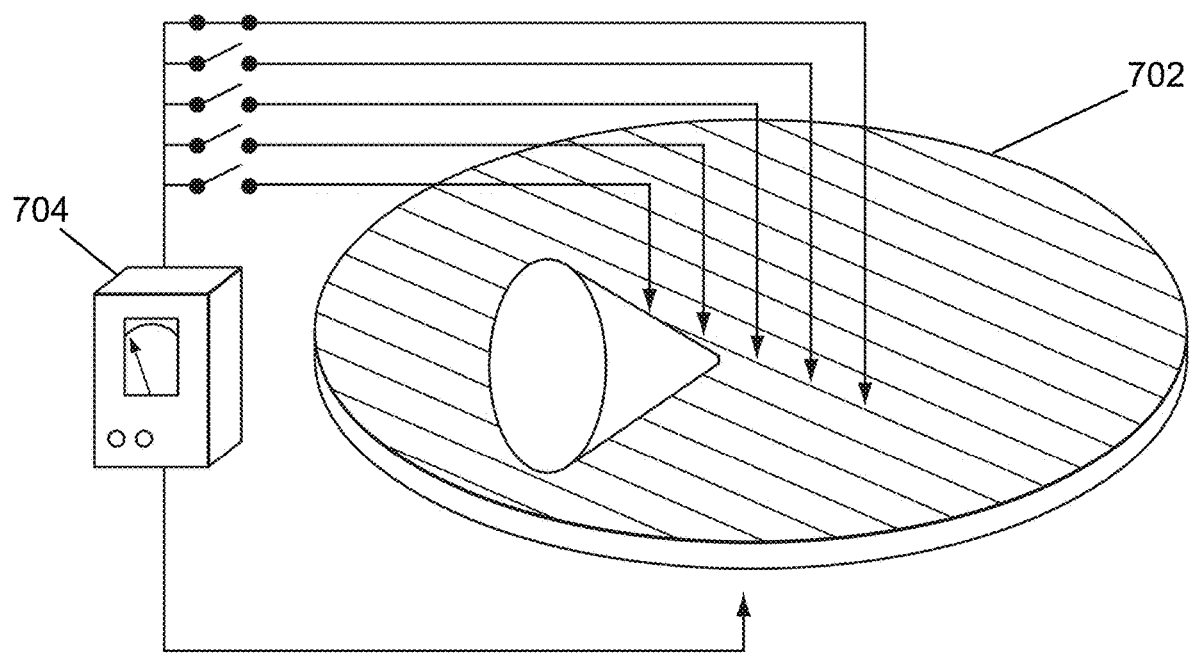
FIG. 7 shows a schematic diagram illustrating on-wafer testing enabling characterization of laser diodes before they are separated into bar or die form.

To reduce the packaging cost of laser diodes chip testing is often performed such that only the good laser die are selected for assembly, thereby ensuring that the cost of assembly and package materials is not spent on laser chips that are defective or do not meet specifications. Such chip testing requires special tooling to handle the individual die, pass them through the tester, and then sort them into passing and failing groups. Conventional chip testing systems are designed to be compatible with die sizes wherein ridge widths of 150 μm to 200 μm and greater. Therefore, performing chip testing on very narrow chips down to the 50 μm to 100 μm range can be difficult and potentially costly. In the methods and devices provided by the present disclosure etched facets are used, which enables a laser die to be individually tested in wafer form because the testing process does not rely on the cleaving process applied to separated die to define the mirrors. By measuring characteristics such as the threshold current density, voltage versus current, and light out versus current relationship the individual die can be fully characterized and binned into passing or failing groups prior to singulation. After the wafer is singulated into individual die only the passing devices are packaged thereby avoiding chip testing of individual, singulated die. FIG. 7 shows a schematic diagram of on-wafer testing of laser diodes prior to cleaving and singulation of individual die. FIG. 7 shows a wafer 702 being tested using a testing system 704.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrates in which the largest area surface is nominally an (h k l) plane wherein h=k=0, and l is non-zero), non-polar GaN substrates (i.e., substrates in which the largest area surface is oriented at an angle ranging from about 80 degrees to 100 degrees from the polar orientation described above towards an (h k l) plane wherein l=0, and at least one of h and k is non-zero), and semi-polar GaN substrates (i.e., substrates in which the largest area surface is oriented at an angle ranging from about +0.1 degrees to +80 degrees or from about +110 degrees to about +179.9 degrees from the polar orientation described above towards an (h k l) plane, wherein l=0, and at least one of h and k is non-zero).

In an example, the laser diode device is provided at a wafer level and being subjected to a testing process to characterize a plurality of properties including at least a threshold current density, voltage versus current relationship, or light out versus current relationship.

Laser devices provided by the present disclosure can be enclosed in a suitable package. Such package can include those such as in TO-38 and TO-56 headers. Other suitable package designs and methods are also known, such as TO-9 or flat packs where fiber optic coupling is required and even non-standard packaging. In some embodiments, devices provided by the present disclosure can be implemented in a co-packaging configuration such as those described in U.S. Provisional Application No. 61/347,800, published as U.S. Publication No. 2011/0286484, each of which is incorporated by reference in its entirety. In an example, the package can include a configuration having p-type side down, and bonding via wiring on a backside of the laser device, among other configurations.

In some embodiments, laser devices provided by the present disclosure can be configured for use in a variety of applications. Such applications include laser displays, metrology, communications, health care and surgery, information technology, and others. As an example, a laser device can be provided in a laser display such as those described in U.S. application Ser. No. 12/789,303, filed on May 27, 2010, issued as U.S. Pat. No. 8,427,590, each of which is incorporated by reference in its entirety.

While the above is a full description of specific embodiments, various modifications, alternative constructions and equivalents may be used. As an example, a packaged device can include any combination of elements described above, as well as others. Therefore, the above description and illustrations should not be taken as limiting the scope of the present invention which is defined by the appended claims.

What is claimed is:

1. A system comprising:
a gallium and nitrogen containing optical device operable as a laser diode; and
a package configured to enclose the optical device;
wherein the optical device is configured for use in an application, the optical device comprising:
a gallium and nitrogen containing member having a semipolar surface orientation selected from the (20-21) or (20-2-1) or (30-31) or (30-3-1) or (11-22) plane orientations, or an offcut of any of the foregoing orientations;
a chip formed from the gallium and nitrogen containing member, the chip having a width and a length, the width of the chip being a distance between sides of the chip and the length of the chip being a distance between ends of the chip, the chip also having a p-type region and an n-side contact opposite the p-type region;
a ridge waveguide configured to emit laser light, the ridge waveguide oriented substantially parallel to the length of the chip and having a pair of etched facets configured on the ends thereof, the ridge waveguide having a width that is less than the width of the chip;
at least one wirebond disposed on the n-side contact of the chip for coupling a wire to the chip, wherein the width of the chip is no more than a width of the at least one wirebond; and
a submount coupled to the chip such that the p-type region of the chip is facing the submount.

2. The system of claim 1, wherein the application is selected from an optical application, a laser application, a display application, a metrology application, a communications application, a health care application, a surgery application, and an information technology application.

3. The system of claim 1, wherein the width of the chip is either less than 110 microns or less than 70 microns.

4. The system of claim 1, wherein the laser diode is operable at a wavelength from 430 nm to 480 nm or from 480 nm to 535 nm or from 390 nm to 430 nm.

5. The system of claim 1, wherein the gallium and nitrogen containing member has a (20-21) surface orientation or an offcut thereof.

6. The system of claim 1, wherein the gallium and nitrogen containing member has a (30-31) surface orientation or an offcut thereof.

7. A system comprising:
a lighting apparatus; and
an optical device configured to provide light for the lighting apparatus, the optical device operable as a laser diode;
wherein the optical device is configured for use in an application, the optical device comprising:
a gallium and nitrogen containing member;

a chip formed from the gallium and nitrogen containing member, the chip having a width and a length, the width of the chip being a distance between sides of the chip and the length of the chip being a distance between ends of the chip, the chip also having a p-type region and an n-side contact opposite the p-type region;

a ridge waveguide configured to emit laser light, the ridge waveguide oriented substantially parallel to the length of the chip and having a pair of etched facets configured on the ends thereof, the ridge waveguide having a width that is less than the width of the chip;

at least one wirebond disposed on the n-side contact of the chip for coupling a wire to the chip, wherein the width of the chip is no more than a width of the at least one wirebond plus a minimum wirebonding placement tolerance; and a submount coupled to the chip such that the p-type region of the chip is facing the submount.

8. The system of claim 7, wherein the application is selected from an optical application, a laser application, a display application, a metrology application, a communications application, a health care application, a surgery application, and an information technology application.

9. The system of claim 7, wherein the width of the chip is less than 110 microns.

10. The system of claim 7, wherein the width of the chip is less than 70 microns.

11. The system of claim 7, wherein the optical device is operable at a wavelength from 430 nm to 480 nm.

12. The system of claim 7, wherein the optical device is operable at a wavelength from 480 nm to 535 nm.

13. The system of claim 7, wherein the optical device is operable at a wavelength from 390 nm to 430 nm.

14. The system of claim 7, wherein the gallium and nitrogen containing member of the optical device has a semipolar surface orientation selected from the (20-21) or (20-2-1) or (30-31) or (30-3-1) or (11-22) plane orientations, or an offcut of any of the foregoing orientations.

15. The system of claim 7, wherein the gallium and nitrogen containing member of the optical device has a nonpolar surface orientation, or an offcut thereof.

16. A system comprising:

a gallium and nitrogen containing optical device operable as a laser diode;

wherein the optical device is configured for use in an application, the optical device comprising:

a chip comprising a gallium and nitrogen containing member, the chip having a width and a length, the width of the chip being a distance between sides of the chip and the length of the chip being a distance between ends of the chip, the chip also having a p-type region and an n-side contact opposite the p-type region;

a ridge waveguide configured to emit laser light, the ridge waveguide oriented substantially parallel to the length of the chip and having a pair of etched facets configured on the ends thereof, the ridge waveguide having a width that is less than the width of the chip;

at least one wirebond on the n-side contact of the chip for coupling a wire to the chip, wherein the width of the chip is no more than a width of the at least one wirebond; and a submount coupled to the chip such that the p-type region of the chip is facing the submount.

17. The system of claim 16, wherein the width of the chip is either less than 110 microns or less than 70 microns.

18. The system of claim 16, wherein the laser diode is operable at a wavelength from 430 nm to 480 nm or from 480 nm to 535 nm or from 390 nm to 430 nm.

19. The system of claim 16, wherein the gallium and nitrogen containing member has a semipolar surface orientation selected from the (20-21) or (20-2-1) or (30-31) or (30-3-1) or (11-22) plane orientations, or an offcut of any of the foregoing orientations.

20. The system of claim 16, wherein the application is selected from an optical application, a laser application, a display application, a metrology application, a communications application, a health care application, a surgery application, and an information technology application.

\* \* \* \* \*